(12) United States Patent
Hsiao et al.

(10) Patent No.: US 7,661,846 B2
(45) Date of Patent: Feb. 16, 2010

(54) FIXING STRUCTURE AND BACKLIGHT MODULE USING THE SAME

(75) Inventors: Meng-Jia Hsiao, Hsin-Chu (TW); Kuo-Tung Huang, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 154 days.

(21) Appl. No.: 11/802,946

(22) Filed: May 29, 2007

(65) Prior Publication Data

US 2008/0089076 A1 Apr. 17, 2008

(30) Foreign Application Priority Data

Oct. 12, 2006 (TW) ............... 95137612 A

(51) Int. Cl.
*F21V 21/00* (2006.01)

(52) U.S. Cl. ............ 362/249.04; 362/97.3; 362/249.03; 362/600; 313/500

(58) Field of Classification Search ............ 362/249.02, 362/249.03, 249.04, 97.3, 368, 396, 600, 362/634; 361/748; 313/500; 349/58

See application file for complete search history.

(56) References Cited

FOREIGN PATENT DOCUMENTS

| CN | 2485563 Y | 4/2002 |
|----|-----------|--------|
| CN | 1605912 A | 4/2005 |
| CN | 1664674 A | 9/2005 |
| TW | M242984 | 9/2004 |
| TW | M283409 | 1/2005 |

*Primary Examiner*—John A Ward
(74) *Attorney, Agent, or Firm*—Bacon & Thomas, PLLC

(57) ABSTRACT

A fixing structure and a backlight module using the same are provided. The fixing structure is used for fixing a circuit board. The circuit board with several openings has an upper surface and a lower surface. The fixing structure includes a back plate and several hooks. The back plate has a contact surface. These hooks are disposed on the contact surface. The hooks go through the openings so that the contact surface contacts the lower surface. The hooks move toward the walls of the openings and press against the upper surface so as to fix the circuit board onto the back plate.

16 Claims, 3 Drawing Sheets

US 7,661,846 B2

FIXING STRUCTURE AND BACKLIGHT MODULE USING THE SAME

This application claims the benefit of Taiwan Patent Application Serial No. 95137612, filed Oct. 12, 2006, the subject matter of which is incorporated herein by reference.

BACKGROUND OF THE INVENTION

1. Field of the Invention

The invention relates in general to a fixing structure, and more particularly to a fixing structure applied to a backlight module.

2. Description of the Related Art

In a common backlight module of the liquid crystal display (LCD) device, a cold cathode fluorescent lamp (CCFL) or a light emitting diode (LED) is used as a back light source. In the liquid crystal display device with a light emitting diode as the back light source, the light emitting diode is usually soldered to a printed circuit board (PCB), and the printed circuit board is fixed onto a back plate of the backlight module by screws.

In order to transmit the heat generated by the light emitting diode to the back plate, the printed circuit board has to be attached to the back plate closely as a smooth flat, so that the light emitting diode could be prevented from damaging by the heat. However, the printed circuit board is usually fixed to the back plate via several screws conventionally. While inserting the screws into the printed circuit board, it is very likely to pass over some of the screws accidentally. Even if only a minor number of screws are not inserted into the printed circuit board, the printed circuit board cannot be fixed to the back plate as a smooth flat. Furthermore, when the screws are all inserted into the printed circuit board, it is still very difficult to ensure that every screw applies the same force to the printed circuit board. Therefore, the method of screwing the printed circuit board leads to some drawbacks, such as increasing the manufacturing cost and the assembling time, and lowering the yield rate and the quality of product.

Therefore, there exists a major issue that needs to be solved to closely and efficiently fix the printed circuit board onto the back plate in a backlight module.

SUMMARY OF THE INVENTION

The invention is directed to a fixing structure and a backlight module using the same. A circuit board is fixed onto the back plate closely and uniformly through the application of several hooks disposed on a back plate and some openings formed in a circuit board.

According to the present invention, a fixing structure for a circuit board is provided. The circuit board with several openings has an upper surface and a lower surface. The fixing structure includes a back plate and several hooks. The back plate has a contact surface. The hooks are disposed on the contact surface. The hooks go through the openings, so that the contact surface contacts the lower surface. The hooks move toward the walls of the openings and press against the upper surface so as to fix the circuit board onto the back plate.

According to the present invention, a backlight module including a circuit board, a light emitting device and a fixing structure is provided. The circuit board with several openings has an upper surface and a lower surface. The light emitting device is disposed on the circuit board for providing a backlight source. The fixing structure used for fixing the circuit board includes a back plate and several hooks. The back plate has a contact surface. The hooks are disposed on the contact surface. The hooks go through the openings, so that the contact surface contacts the lower surface. The hooks move toward the walls of the openings and press against the lower surface so as to fix the circuit board onto the back plate.

According to the present invention, another backlight module including a light source structure and a back plate is provided. The light source structure includes a circuit board and a light emitting device. The circuit board with several openings has an upper surface and a lower surface. The light emitting device is disposed on the circuit board for providing a backlight module. The back plate includes a fixing structure and a contact surface. The fixing structure used for fixing the circuit board includes several hooks. The hooks are disposed on the contact surface. The hooks go through the openings, so that the contact surface contacts the lower surface. The hooks move toward the walls of the openings and press against the upper surface so as to fix the circuit board onto the back plate.

The invention will become apparent from the following detailed description of the preferred but non-limiting embodiments. The following description is made with reference to the accompanying drawings.

DETAILED DESCRIPTION OF THE INVENTION

First Embodiment

Figure 1A:
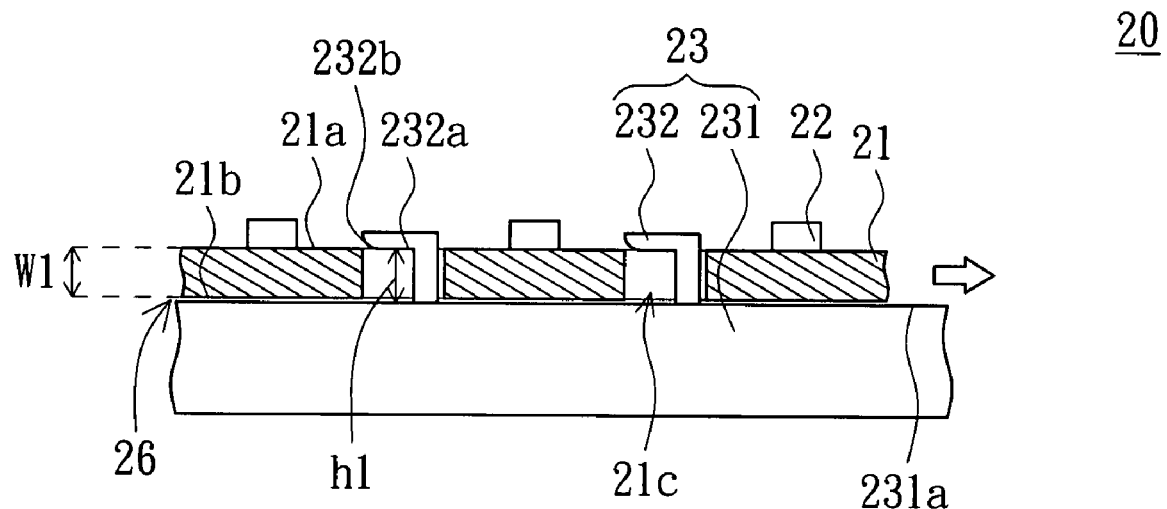
FIG. 1A illustrates a backlight module according to a first embodiment of the present invention.
Figure 1B:
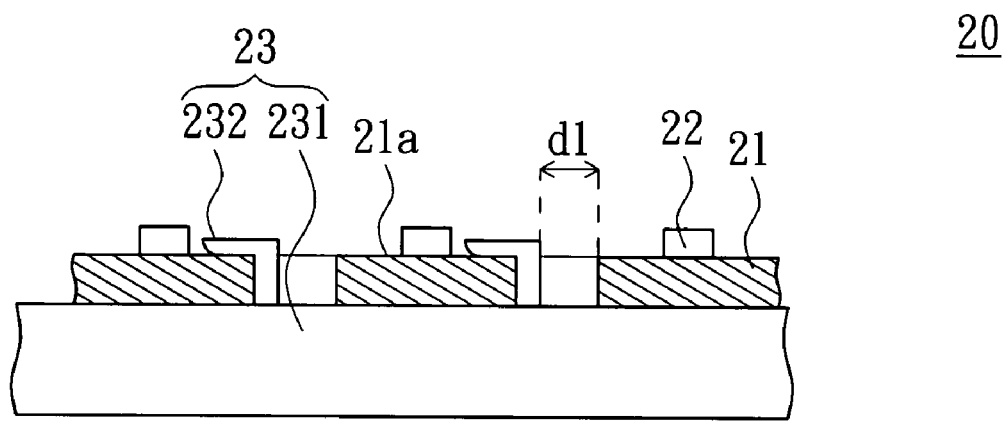
FIG. 1B illustrates a circuit board in FIG. 1A shifted a distance on a back plate.
Figure 1C:
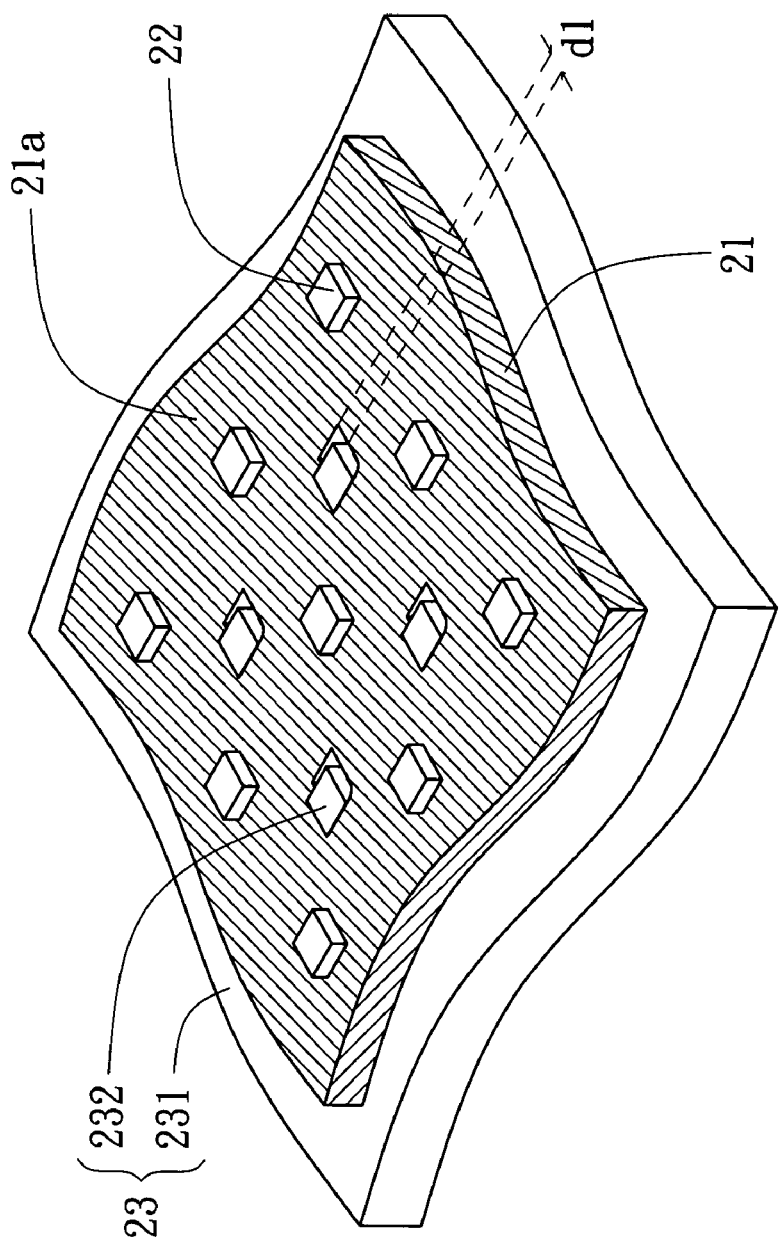
FIG. 1C is a three dimensional view of the backlight module in FIG. 1B.

Referring to FIG. 1A, a backlight module according to a first embodiment of the present invention is illustrated. The backlight module 20 includes a circuit board 21, a light emitting device 22 and a fixing structure 23. The circuit board 21 with several openings 21c has an upper surface 21a and a lower surface 21b. The light emitting device 22 is disposed on the circuit board 21 for providing a backlight source. The fixing structure 23 used for fixing the circuit board 21 includes a back plate 231 and several hooks 232. The back plate 231 has a contact surface 231a. The hooks 232 are disposed on the contact surface 231a for connecting the circuit board 21. The hooks 232 go through the openings 21c, so that the contact surface 231a contacts the lower surface 21b. FIG. 1B illustrates the circuit board in FIG. 1A shifted a distance on the back plate. FIG. 1C is a three dimensional view of the backlight module in FIG. 1B. The circuit board 21 is shifted a distance d1 on the back plate 231, so that the hooks 232 move toward the walls of the openings 21c and press against the upper surface 21a. Accordingly, the circuit board 21 is fixed onto the back plate 231.

Moreover, each hook 232 has a curve surface 232b and a connecting surface 232a. The curve surface 232b is disposed at a front edge of the connecting surface 232a. When each hook 232 connects to the circuit board 21, the circuit board 21 moves to the connecting surface 232a along the curve surface 232b. The height h1 between the connecting surface 232a and the back plate 231 is less than the thickness w1 of the circuit board 21. Therefore, when each hook 232 connects to the circuit board 21, the connecting surface 232a presses against the upper surface 21a of the circuit board 21. Each hook 232 applies a force to the upper surface 21a, so that the circuit board 21 presses against the back plate 231 closely. Therefore, there is no gap 26 (the gap 26 is shown in FIG. 1A) between the circuit board 21 and the back plate 231.

In the present embodiment, the width of the openings 21c is at least equal to the width of the hooks 232 for the hooks 232 going through the openings 21c. The back plate 231 is preferably made of metal for providing sufficient support, so that the backlight module 20 can be prevented from bending, and the circuit board 21 can be maintained in a smooth flat. The hooks 232 and the back plate 231 are preferably formed integrally to lower the manufacturing cost. The light emitting device 22 is a light emitting diode (LED) for example.

In the backlight module 20 of the present embodiment, the hooks 232 go through the openings 21c, and then the circuit board 21 moves a distance d1 on the back plate 231 to fix the circuit board 21. Because each of the hooks 231 matches one opening 21c, the sideway sliding of the circuit board 21 relative to the back plate 231 is confined. Further, the height h1 between the connecting surface 232a and the back plate 231 is less than the thickness w1 of the circuit board 21, so the circuit board 21 presses against the back plate 231 closely. Consequently, the circuit board 21 is fixed onto the back plate 231 stably and uniformly.

Second Embodiment

Figure 2:
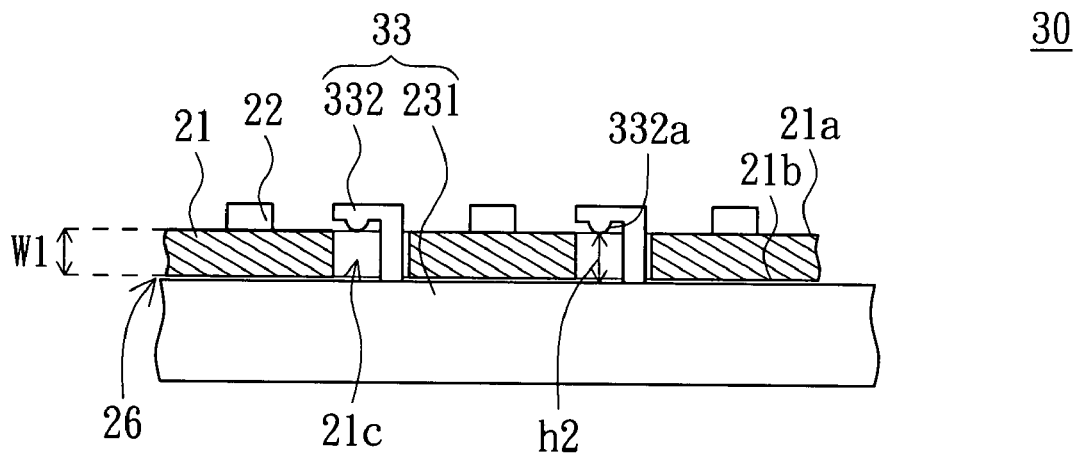
FIG. 2 illustrates a backlight module according to a second embodiment of the present invention.

Referring to FIG. 2, a backlight module according to a second embodiment of the present invention is illustrated. The backlight module 30 includes a circuit board 21, a light emitting device 22 and a fixing structure 33. The fixing structure 33 for fixing the circuit board 21 includes a back plate 231 and several hooks 332. The backlight module 30 of the present embodiment and the backlight module 20 of the first embodiment are different in the design of the hooks 332. The other same parts are not described repeatedly.

In the present embodiment, each hook 332 has a protruding point 332a. The height h2 between the protruding point 332a and the back plate 231 is less than the thickness w1 of the circuit board 21. Therefore, when each hook 332 is connected to the circuit board 21, the protruding point 332a presses against the upper surface 21a of the circuit board 21. Each hook 332 applies a force to the upper surface 21a through the protruding point 332a, so that the circuit board 21 presses against the back plate 231 closely.

In the backlight module 30 of the present embodiment, the hooks 332 go through the openings 21c and press against the upper surface 21a of the circuit board 21 through the protruding points 332a. Therefore, the circuit board 21 is fixed onto the back plate 231 stably.

Third Embodiment

Figure 3A:
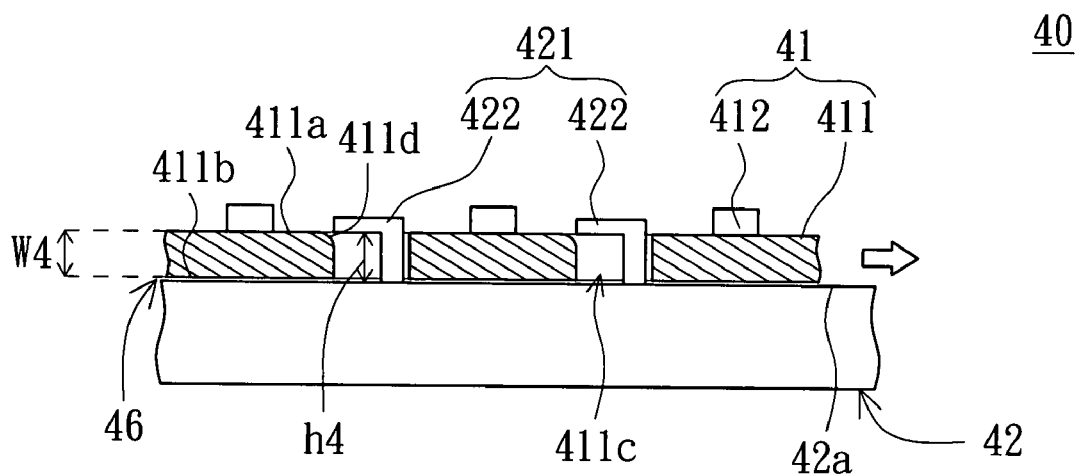
FIG. 3A illustrates a backlight module according to a third embodiment of the present invention.
Figure 3B:
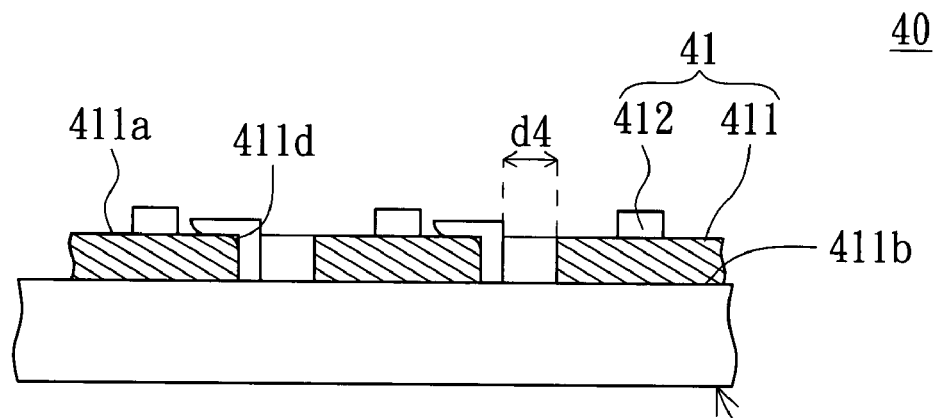
FIG. 3B illustrates a circuit board in FIG. 3A shifted a distance on a back plate.

Referring to FIG. 3A, a backlight module according to a third embodiment of the present invention is illustrated. The backlight module 40 includes a light source structure 41 and a back plate 42. The light source structure 41 includes a circuit board 411 and a light emitting device 412. The circuit board 411 with several openings 411c has an upper surface 411a and a lower surface 411b. The light emitting device 412, such as a light emitting diode (LED), is disposed on the circuit board 411 for providing a backlight source. The back plate 42 includes a fixing structure 421 and a contact surface 42a. The fixing structure 421 for fixing the circuit board 411 includes several hooks 422. The hooks 422 are disposed on the contact surface 42a for connecting to the circuit board 411. The hooks 422 go through the openings 411c, so that the contact surface 42a contacts the lower surface 411b. Please refer to FIG. 3B at the same time. FIG. 3B illustrates the circuit board in FIG. 3A shifted a distance on the back plate. The circuit board 411 is shifted a distance d4 on the back plate 42, so that the hooks 422 move towards the walls 411d of the opening 411c and press against the upper surface 411a. As a result, the circuit board 411 is fixed onto the back plate 42.

The wall 411d of each opening 411c is a curve surface. The height h4 of each hook 422 is less than the thickness w4 of the circuit board 411. When connected to the circuit board 411, each hook 422 moves to the upper surface 411a along the curve surface. Each hook 422 applies a force to the upper surface 411a for pressing the circuit board 411 against the back plate 42 closely. As a result, there is no gap 46 (the gap 46 is shown in FIG. 3A) between the circuit board 411 and the back plate 42. The width of the openings 411c is at least equal to the width of the hooks 422, so that the hooks 422 are able to go through the openings 411c. The back plate 42 is preferably made of metal for providing enough support, so that the circuit board 411 of the backlight module 40 is not warped or even broken due to external force. As a result, the light source structure 41 provides a uniform back light source.

In the backlight module 40 of the present embodiment, the hooks 422 go through the openings 411c and are connected to the circuit board 411. As a result, the light source structure 41 is fixed onto the back plate 42 closely, and the circuit board 411 is fixed on the back plate 42. Furthermore, there is no gap 46 between the circuit board 411 and the back plate 42.

In the fixing structure and the backlight module using the same according to the embodiments of the present invention, several hooks disposed on the back plate are used for matching the openings formed in the circuit board. As a result, the circuit board is fixed onto the back plate while the hooks are connected to the openings. There is no need to insert screws, and there would be no miss screwing. As a result, the assembling time is reduced, and the circuit board is disposed flatly due to the uniform force applied to the circuit board. The fixing structure and the backlight module using the same according to the preferred embodiments described above have at least the following advantages:

1. Only several hooks are needed to be disposed on the back plate, and several corresponding openings are formed on the circuit board to fix the circuit board onto the back plate stably and closely. The structure is simple, so the cost for developing complex mold is saved.

2. While fixing the circuit board onto the back plate, the hooks go through the openings, and the circuit board moves a distance on the back plate. The steps of fixing the circuit board are quick and easy.

3. Each hook goes through one opening correspondingly. As a result, the sideway sliding of the circuit board relative to the back plate is prevented after being fixed.

4. Several hooks are connected to the circuit board to fix the circuit board to the back plate closely. The flatness of the circuit board is maintained, and the product quality and yield rate are improved accordingly.

While the invention has been described by way of example and in terms of several preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A backlight module comprising:
 a circuit board with a plurality of openings, the circuit board having an upper surface and a lower surface;
 a light emitting device, disposed on the circuit board, for providing a backlight source; and
 a fixing structure for fixing the circuit board, the fixing structure comprising:
 a back plate having a contact surface; and
 a plurality of hooks disposed on the contact surface;
 wherein the hooks go through the openings, so that the contact surface contacts the lower surface, and the hooks move toward the walls of the openings and press against the upper surface so as to fix the circuit board onto the back plate.

2. The backlight module according to claim 1, wherein each hook has a connecting surface, and when the hooks are connected to the circuit board, the connecting surface presses against the upper surface of the circuit board.

3. The backlight module according to claim 2, wherein the height between the connecting surface and the back plate is less than the thickness of the circuit board.

4. The backlight module according to claim 2, wherein each hook has a curve surface formed at a front edge of the connecting surface.

5. The backlight module according to claim 2, wherein each hook comprises a protruding point formed on the connecting surface.

6. The backlight module according to claim 5, wherein the height between the protruding point and the back plate is less than the thickness of the circuit board.

7. The backlight module according to claim 1, wherein the wall of each opening is a curve surface.

8. The backlight module according to claim 1, wherein the width of the openings is at least equal to the width of the hooks.

9. A backlight module comprising:
 a light source structure comprising:
 a circuit board with a plurality of openings, the circuit board having an upper surface and a lower surface; and
 a light emitting device disposed on the circuit board for providing a backlight source; and
 a back plate having a contact surface and a fixing structure for fixing the circuit board, the fixing structure comprising:
 a plurality of hooks disposed on the contact surface;
 wherein the hooks go through the openings so that the contact surface contacts the lower surface, and the hooks move towards the walls of the openings and press against the upper surface so as to fix the circuit board onto the back plate.

10. The backlight module according to claim 9, wherein each hook has a connecting surface, and when the hooks are connected to the circuit board, the connecting surface presses against the upper surface of the circuit board.

11. The backlight module according to claim 2, wherein the height between the connecting surface and the back plate is less than the thickness of the circuit board.

12. The backlight module according to claim 10, wherein each hook has a curve surface formed at a front edge of the connecting surface.

13. The backlight module according to claim 10, wherein each hook comprises a protruding point formed on the connecting surface.

14. The backlight module according to claim 13, wherein the height between the protruding point and the back plate is less than the thickness of the circuit board.

15. The backlight module according to claim 9, wherein the wall of each opening is a curve surface.

16. The backlight module according to claim 9, wherein the width of the openings is at least equal to the width of the hooks.

* * * * *